(12) United States Patent
Thompson et al.

(10) Patent No.: US 6,494,217 B2
(45) Date of Patent: Dec. 17, 2002

(54) LASER CLEANING PROCESS FOR SEMICONDUCTOR MATERIAL AND THE LIKE

(75) Inventors: Danny L. Thompson, Mesa, AZ (US); Mary C. Freeman, Phoenix, AZ (US); Ronald N. Legge, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 191 days.

(21) Appl. No.: 09/768,107

(22) Filed: Jan. 23, 2001

(65) Prior Publication Data

US 2001/0011545 A1 Aug. 9, 2001

Related U.S. Application Data

(63) Continuation-in-part of application No. 09/041,417, filed on Mar. 12, 1998, now abandoned.

(51) Int. Cl.$^7$ .................................................. B08B 7/04
(52) U.S. Cl. ............................. 134/1.3; 134/6; 134/26; 134/30; 134/902
(58) Field of Search ............................. 134/1.3, 6, 26, 134/30, 902, 63; 438/692; 34/275, 266, 273, 259

(56) References Cited

U.S. PATENT DOCUMENTS

| | | | |
|---|---|---|---|
| 4,081,653 A | 3/1978 | Koo | |
| 4,368,080 A | 1/1983 | Langen et al. | |
| 4,629,859 A | 12/1986 | Reddy | |
| 4,670,637 A | 6/1987 | Morrison et al. | |
| 4,720,621 A | 1/1988 | Langen | |
| 4,752,668 A | 6/1988 | Rosenfield et al. | |
| 4,987,286 A | 1/1991 | Allen | |
| 5,024,968 A | 6/1991 | Engelsberg | |
| 5,099,557 A | 3/1992 | Englesberg | |
| 5,114,877 A | 5/1992 | Paoli et al. | |
| 5,531,857 A | 7/1996 | Engelsberg et al. | |
| 5,571,575 A | 11/1996 | Takayanagi | |
| 5,643,472 A | 7/1997 | Engelsberg et al. | |
| 5,800,625 A * | 9/1998 | Engelsberg et al. | 134/1 |
| 6,430,841 B1 * | 8/2002 | Borkowski et al. | 134/104.4 |
| 6,446,355 * | 9/2002 | Jones et al. | 118/715 |

\* cited by examiner

*Primary Examiner*—Alexander Markoff
(74) *Attorney, Agent, or Firm*—William E. Koch

(57) ABSTRACT

A laser cleaning process is disclosed for cleaning the surface of materials, such as semiconductor wafers and the like, which process can be performed at atmospheric pressure. The process includes the steps of providing a structure with a surface having undesirable contaminant particles thereon, wetting the surface with a liquid including reactive or non-reactive liquids, and irradiating the surface using photon energy with sufficient energy to remove the wetting liquid and the undesirable material.

24 Claims, 2 Drawing Sheets

LASER CLEANING PROCESS FOR SEMICONDUCTOR MATERIAL AND THE LIKE

The present application is CIP of based on prior U.S. application Ser. No. 09/041,417, filed on Mar. 12, 1998, now abandoned, which is hereby incorporated by reference, and priority thereto for common subject matter is hereby claimed.

FIELD OF THE INVENTION

The present invention pertains to processes for cleaning surfaces of material and more specifically to a process of cleaning semiconductor wafers.

BACKGROUND OF THE INVENTION

In the most common prior art cleaning methods, wet chemistry is used in conjunction with sound (ultra sonic) energy, heat and/or fluid velocities to prepare the surface of semiconductor wafers and the like. This prior art does not provide, in all cases, adequate surface cleaning or preparation.

More recently, photonic energy has been introduced as a cleaner with additional benefits of surface reactions and simultaneous surface preparation. One of these photonic energy cleaning processes, known as photochemical, uses gas chemistries or liquids in vapor phase which require the condensing of the vapors on the target material to be done in a vacuum environment. An example of this type of cleaning is disclosed in U.S. Pat. No. 4,752,668, entitled "System for Laser Removal of Excess Material From a Semiconductor Wafer", issued Jun. 21, 1988, the laser portion of which is incorporated herein by reference. This severely limits the versatility and usefulness of the prior art processes and unduly complicates them. Another prior art photonic energy cleaning processes, known as photothermic, uses inert process gasses to clean the surface of semiconductors or displays. An example of this type of cleaning is disclosed in U.S. Pat. No. 5,643,472, entitled "Selective Removal of Material by Irradiation", issued Jul. 1, 1997, the laser portion of which is incorporated herein by reference. Further, these prior art processes using lasers prohibit the use of reactive liquids and require high laser energies to provide particle removal.

Thus, it would be highly desirable to provide a cleaning process for surfaces of substrates, such as semiconductor wafers and the like, which is more efficient and versatile.

It is a purpose of the present invention to provide a new and improved laser cleaning process for substrates, such as semiconductors and the like.

It is another purpose of the present invention to provide a new and improved laser cleaning process for substrates, such as semiconductors and the like, which is highly versatile and efficient.

It is still another purpose of the present invention to provide a new and improved laser cleaning process for semiconductors and the like with the ability to simultaneously remove surface contaminants and prevent unwanted cleaning residues.

It is a further purpose of the present invention to provide a new and improved laser cleaning process for semiconductors and the like using liquid so that the generation of additional thermal reaction occurs at lower laser fluences.

It is still a further purpose of the present invention to provide a new and improved laser cleaning process for semiconductors and the like which enables the manufacturing of more complex structures with ultra clean semiconductor films without the negative impact of harsh chemicals to the material systems.

SUMMARY OF THE INVENTION

The above problems and others are at least partially solved and the above purposes and others are realized in a laser cleaning process for the surface of materials including the steps of providing a structure with a surface including thereon undesirable material to be removed, applying a wetting liquid to the surface of the structure, and irradiating the surface, using photon energy, with sufficient energy to remove the wetting liquid and the undesirable material. The wetting liquid can include reactive or non-reactive liquids and the irradiating step can be performed at atmospheric pressure.

BRIEF DESCRIPTION OF THE DRAWINGS

Referring to the drawings.

DESCRIPTION OF THE PREFERRED EMBODIMENTS

Figure 1:
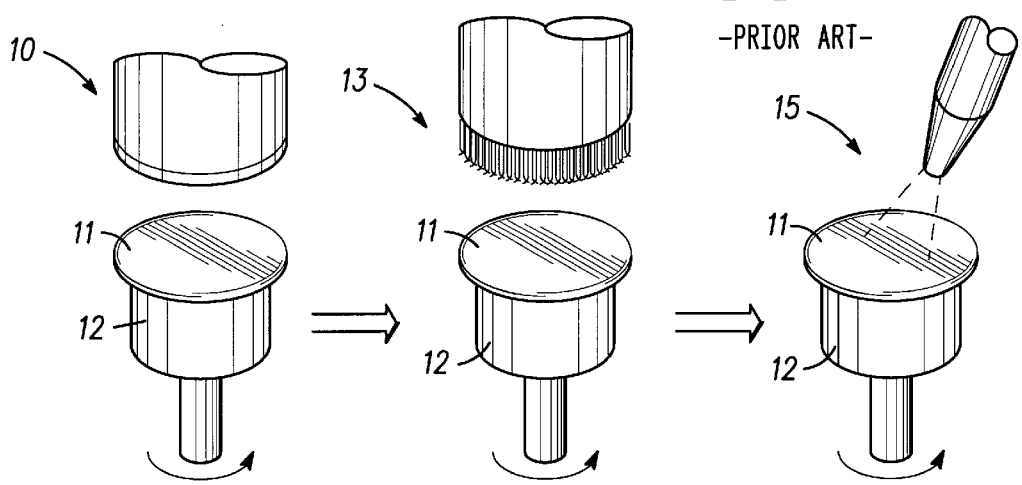
FIG. 1 illustrates schematically a prior art semiconductor line process for wafer polishing and cleaning.

Turning now to the figures, FIG. 1 illustrates in a simplified schematic form a prior art semiconductor line process for wafer polishing and cleaning. In a first stage, designated 10, each semiconductor wafer 11, mounted on a chuck 12 is subjected to a chemical mechanical polish (CMP). In the CMP process each wafer 11 is exposed to dilute chemicals in which silica or similar particles are entrained. Because the CMP process is well known to those skilled in the art, further description of this process is not included herein. After the CMP process, each wafer 11 moves to a second stage, designated 13, in which each wafer 11 is processed through a scrub track that removes gross contamination. Scrub tracks are also well known in the cleaning art and will not be described further. Subsequent to the scrub track process, wafers 11 are each moved along the line to a third stage, designated 15. Stage 15 is a spin rinse dryer (SRD) which does a final rinse and dry process to complete the line process. Wafers 11 are then removed from the chucks 12 and packaged for further processing.

Figure 2:
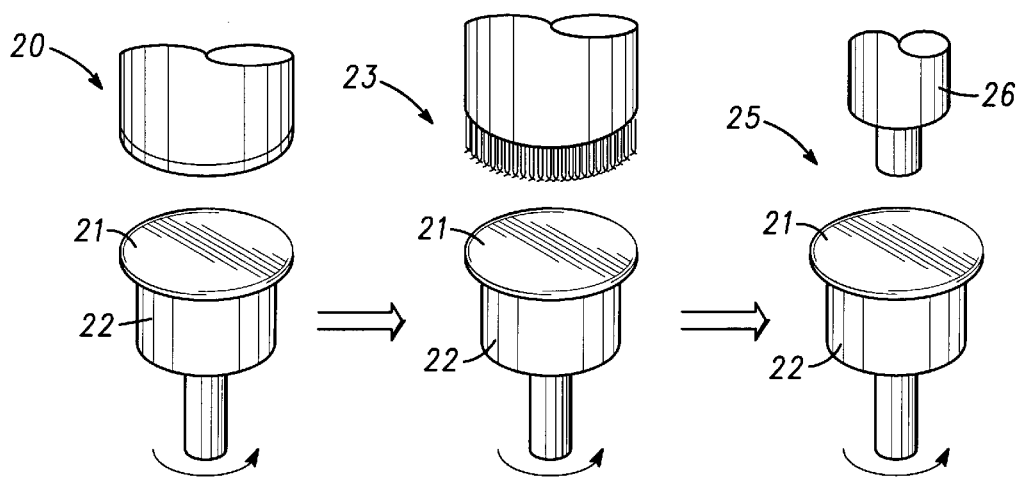
FIG. 2 illustrates schematically a line process for substrate polishing and cleaning in accordance with the present invention.

Referring specifically to FIG. 2, a specific example of a substrate line process, such as a semiconductor wafer line process for wafer polishing and cleaning in accordance with the present invention is illustrated. The line process is again illustrated in a simplified schematic view. In a first stage, designated 20, each substrate, or semiconductor wafer, 21, mounted on a chuck 22 is subjected to a chemical mechanical polish (CMP). In the CMP process each wafer 21 is exposed to dilute chemicals in which silica or similar particles are entrained. After the CMP process, each wafer 21, now having a plurality of contaminant particles on the surface, generated during the CMP process, moves to a second stage, designated 23, in which each wafer 21 is processed through a scrub track that removes gross contamination. During this second stage 23, a scrub process is performed by essentially applying a liquid to the surface of the semiconductor wafer, suspending therein the plurality of contaminant particles. Subsequently, during this second stage 23, a majority of this liquid having contaminant particles entrained therein is removed. Subsequent to the scrub track process of stage 23, wafers 21 are each moved along the line to a third stage, designated 25. Stage 25 includes a laser cleaning and drying process in which photonic energy from a laser 26 is directed onto the surface to be cleaned, e.g. the surface of wafer 21. The laser cleaning and drying process, in this specific example, replaces the SRD step illustrated in FIG. 1. In this process the scrub track step 23 dispenses a liquid to the surface of each wafer 21 and the photonic energy of laser 26 in step 25 removes the liquid and solids while simultaneously drying the surface.

Figure 3:
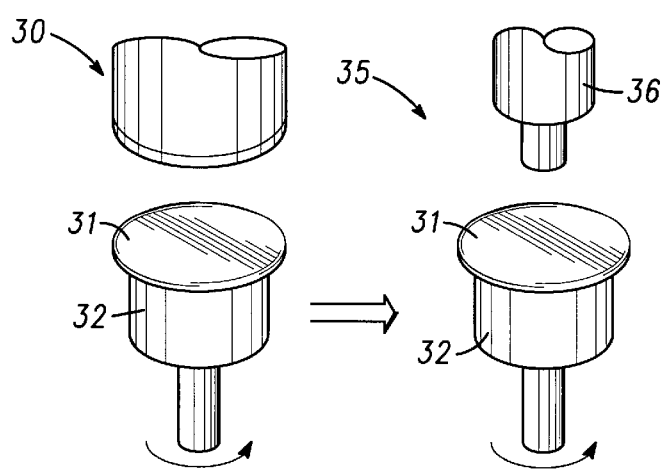
FIG. 3 illustrates schematically a line process for substrate polishing and cleaning in accordance with the present invention.

Referring specifically to FIG. 3, another specific example of a line process for substrate polishing and cleaning in accordance with the present invention is illustrated. The line process is again illustrated in a simplified schematic view. It should be understood that while semiconductor wafer polishing and cleaning is disclosed in the preferred embodiment, that anticipated by this disclosure is a process for cleaning and polishing various metal substrates used in micromachining, and glass substrates, such as that utilized for lens manufacture, etc. is anticipated by this disclosure. Accordingly, the term substrate materials is intended to include semiconductor materials, metals, glass, or the like.

In a first stage, designated 30, each semiconductor wafer 31, mounted on a chuck 32 is subjected to a chemical mechanical polish (CMP). In the CMP process each wafer 31 is exposed to dilute chemicals in which silica or similar particles are entrained. Subsequent to the CMP process of stage 30, wafers 31, having a plurality of contaminant particles, generated during the CMP process, and now chemisorbed in the remaining liquid, are each moved along the line to a second stage, designated 35.

Stage 35 includes a laser cleaning and drying process in which an energy source 36, such as a photonic energy source, such as a laser as illustrated here, an ion energy source, such as an ion beam, or a neutralized ion energy source is directed onto the surface to be cleaned, e.g. the surface of wafer 31. The cleaning and drying process, in this specific example, replaces both the scrub process and the SRD step illustrated in FIG. 1. In this example, the CMP process of step 30 dispenses a liquid to the surface of each wafer 31 and the photonic energy of laser 36 in step 35 removes the liquid and solids while simultaneously drying the surface. It should be understood that during the irradiation stage 35 that a single process step is undertaken whereby the surface of the substrate material is irradiated by moving the energy source relative to the surface of the substrate material, or vice versa, so as to irradiate the entire surface of the substrate in a continuous manner. It is anticipated by this disclosure that dependent upon the illumination size of the energy source and the size of the surface area to be irradiated, that the entire surface can be irradiated without the need to move either the energy source or the surface of the substrate relative to one another.

Figure 4:
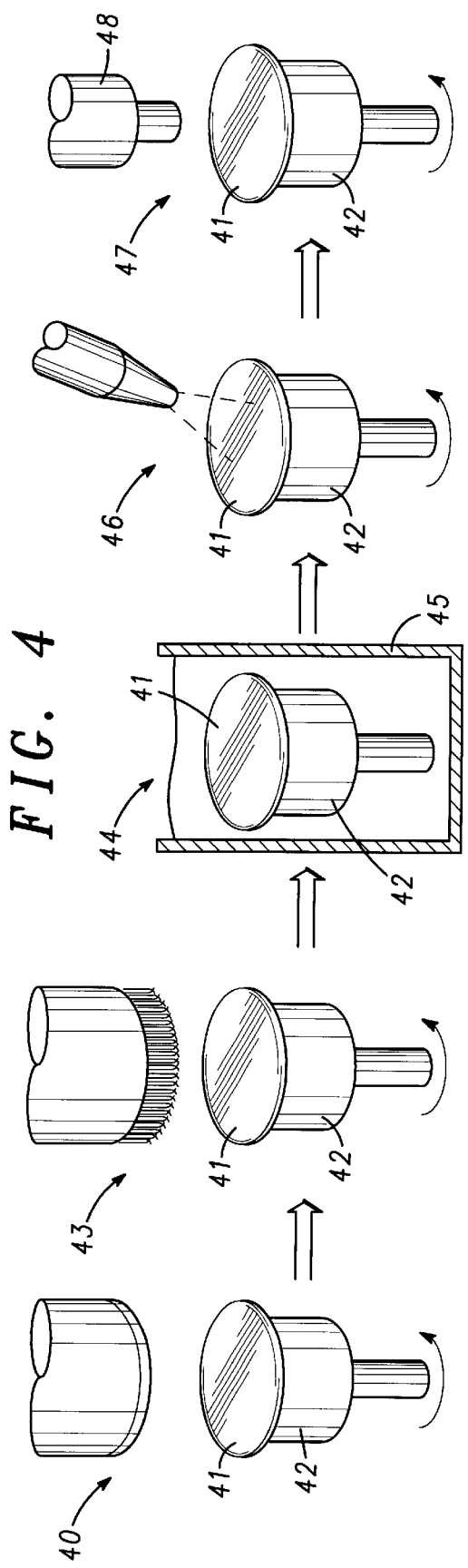
FIG. 4 illustrates schematically a semiconductor line process for wafer polishing and cleaning in accordance with the present invention.

Turning now to the figures, FIG. 4 illustrates in a simplified schematic form a semiconductor line process for wafer polishing and cleaning. In a first stage, designated 40, each semiconductor wafer 41, mounted on a chuck 42 is subjected to a chemical mechanical polish (CMP). In the CMP process each wafer 41 is exposed to dilute chemicals in which silica or similar particles are entrained. Because the CMP process is well known to those skilled in the art, further description of this process is not included herein. After the CMP process, each wafer 41 moves to a second stage, designated 43, in which each wafer 41 is processed through a scrub track that removes gross contamination. Scrub tracks are also well known in the cleaning art and will not be described further. Subsequent to the scrub track process, wafers 11 are each moved along the line to a third stage, designated 45. Stage 45 is a caustic bath process in which wafer 42 is washed in a caustic solution for the removal of specific materials which have accumulated from other steps or through natural occurrences. A stage 46 generally follows stage 44. Stage 46 is a spin rinse dryer (SRD) which does a final rinse and dry process to complete the line process. Wafers 41 are then removed from the chucks 42 and packaged for further processing.

It will be understood that the semiconductor line process illustrated in FIG. 4, is intended to illustrate the use of stage 43, the caustic bath process, in accordance with the present invention. Also, while a laser dry and cleaning stage 47 is illustrated as following stage 46, the spin rinse dryer stage, it should be understood that stage 46 is optional and stage 47 could follow stage 44 directly. Also, stages 40 and 43 are optional, at least in some applications.

Figure 5:
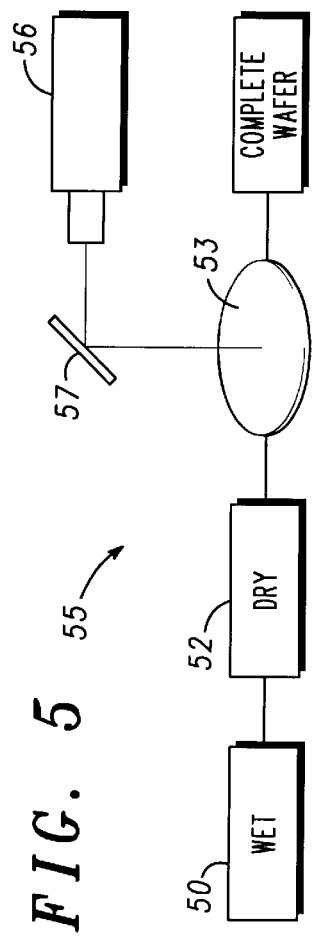
FIG. 5 is a simplified general flow chart illustrating general steps in a process in accordance with the present invention.

Turning now to FIG. 5, a simplified general flow chart is illustrated showing general steps in a process in accordance with the present invention. The general steps include a first step 50 in which the surface to be cleaned is prepared by applying a liquid directly to the work surface. The liquid can be either reactive or non-reactive and is applied in a non-vaporous (liquid) form. More particularly, it is disclosed that the liquid can be reactive or non-reactive to the substrate surface, and/or reactive or non-reactive to the contaminant particles. Further, the liquid can be applied directly to the surface or it can be already present from a prior step. It should be understood that a plurality of contaminant particles present on the semiconductor surface (previously described) will become entrained in the liquid once the liquid is present. The amount of liquid can be copious or minimal, in which copious amounts can be reduced in a second step, designated 52, to a residual layer 53 of liquid of a specified minimal thickness, prior to the application of energy source by spinning, evaporation, etc. It should be noted that typically copious amounts of liquid having contaminant particles entrained therein, are left remaining on a substrate, or wafer surface, subsequent to CMP processing steps. To reduce this copious amount of liquid to residual layer 53 of liquid having contaminant particles entrained therein, the majority, and more specifically substantially the entire surface, of the wafer is dried by spinning the wafer in the horizontal plane so that residual layer 53 having a thickness of less than 20 Å, and preferably less than 10 Å is left remaining on a majority of the wafer surface, thus leaving the desired amount of liquid on the surface prior to the step of irradiating the surface. Alternatively, evaporation techniques may be used to form residual layer 53 of the specified thickness, thus leaving the desired amount of liquid on the surface prior to the step of irradiating the surface. Residual layer 53 of liquid that is left remaining is disclosed and defined herein as including a layer of liquid having a thickness of less than 20 Å, and preferably less than 10 Å. Residual layer 53 remaining is characterized as a monolayer of molecules that are adsorbed on the surface having contaminant particles chemisorbed or adsorbed therein. This process of removing the majority of the liquid from the surface of the substrate, or wafer, prior to the irradiation step, provides for remaining residual layer 53 of liquid of a specific thickness to be left on the surface of the wafer. Residual layer 53 must be of a specific minimal thickness to enable the radiation to properly evaporate the liquid in a sort of explosive fashion, thereby removing the remaining liquid and contaminant particles from the wafer surface. It should be understood that it is anticipated by this disclosure that residual layer 53 may be formed as either a continuous layer or a discontinuous layer, across the surface of the semiconductor wafer. Therefore it is disclosed that residual layer 53 covers a majority of the semiconductor wafer surface. It should further be understood that, depending upon wetting step 50, step 52 may or may not be included in the process.

In a next step, designated 55, the surface to be cleaned is irradiated, using an energy source, with sufficient energy to remove residual layer 53 of wetting liquid and the entrained contaminant particles in a single irradiation process. It is disclosed that anticipated by this disclosure are various energy sources, including photon energy sources, such as any electromagnetic waves, including but not limited to x-ray, IR, RF, gamma, visible, such as laser, or the like. In addition, ion energy sources, such as ion beam sources, and neutralized ion beam sources, are anticipated. In the process illustrated in FIG. 5, the energy is provided by directing the output of a energy source 56 onto a reflecting surface 57 for imaging onto the desired surface. Step 55 is performed at atmospheric pressure since the rapid drying of the liquid on the surface results in contamination removal, while promoting excellent surface conditions. Using the laser to remove the liquid directly provides the ability to simultaneously remove surface contaminants and prevent unwanted cleaning residuals. In this particular embodiment, the irradiation step, and more particularly, the laser irradiation step, is carried out in a single process step across the entire surface area of the wafer, whereby the laser irradiation is commenced subsequent to the removal of the copious amount of liquid (as previously described) to leave remaining residual layer 53 of the liquid having entrained therein contaminant particles on a majority of the wafer surface. The laser also enhances chemical reactions within a zone surrounding the laser beam. The reactions are contained at or near the surface to be cleaned, which provides a great deal of controllability of the reactions. Further, by using liquid at the surface to be cleaned, the generation of additional thermal reaction at lower laser fluences is realized. The use of liquid on the surface and direct laser cleaning lessens the quantity of chemicals used in the cleaning process and the post treatment of the chemicals.

Generally, the new process includes applying a liquid to the surface to be cleaned at the laser stage, applying liquid to the surface to be cleaned prior to the laser stage, or applying liquid to the surface to be cleaned prior to the laser stage and performing a controlled spin to leave a controlled amount of liquid, the residual layer, on the surface. Further, while many cleaning applications are possible, three preferred examples in semiconductor processing are: removal of polishing slurries; enhanced removal of photo resists; and surface preparation prior to film depositions.

Thus, a new and useful cleaning process for semiconductors and the like is disclosed. The new and improved cleaning process for semiconductors and the like is highly versatile and efficient with the ability to simultaneously remove surface contaminants and prevent unwanted cleaning residues. Further, the new and improved cleaning process for semiconductors and the like uses liquid directly on the surface to be cleaned so that the generation of additional thermal reaction occurs at lower laser fluences. Also, the new and improved cleaning process for semiconductors and the like enables the manufacturing of more complex structures with ultra clean semiconductor films without the negative impact of harsh chemicals to the material systems.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A cleaning process for a surface of a semiconductor wafer having undesirable materials thereon, comprising the steps of:

performing a chemical mechanical polish on the surface of the semiconductor wafer, thereby generating a plurality of contaminant particles on the surface of the semiconductor wafer;

performing a scrub by applying a liquid to the surface of the semiconductor wafer suspending therein the plurality of contaminant particles, and removing a majority of the liquid and contaminant particles suspended therein;

removing a majority of the remaining liquid and contaminant particles suspended therein so that only a residual layer of the liquid having a thickness of less than 20 angstroms, and having contaminant particles suspended therein remains on a majority of the wafer surface; and irradiating the residual layer of liquid with energy to remove the remaining residual layer.

2. The cleaning process for the surface of the semiconductor wafer of claim 1 wherein the step of performing scrub includes the step of using a liquid that is one of reactive with the surface or reactive with the particles.

3. The cleaning process for the surface of the semiconductor wafer of claim 1 wherein the step of performing a scrub includes the step of using a liquid that is one of non-reactive with the surface or non-reactive with the particles.

4. The cleaning process for the surface of the semiconductor wafer of claim 1 wherein the step of removing a majority of the liquid so that only a residual layer of the liquid remains on the wafer surface comprises the step of spinning.

5. The cleaning process for the surface of the semiconductor wafer of claim 1 wherein the step of removing a majority of the liquid so that only a residual layer of the liquid remains on the wafer surface comprises evaporation.

6. A cleaning process for a surface of a semiconductor wafer of claim 1 wherein the residual layer is less than 10 angstroms thick.

7. A cleaning process for a surface of a semiconductor wafer of claim 6 wherein the residual layer is a monolayer of molecules adsorbed on the surface of the semiconductor wafer, having the contaminant particles chemisorbed therein.

8. A cleaning process for a surface of a semiconductor wafer of claim 6 wherein the residual layer is a monolayer of molecules adsorbed on the surface of the semiconductor wafer, having the contaminant particles adsorbed therein.

9. A cleaning process for a surface of a semiconductor wafer of claim 1 wherein the energy source is one of a photon energy source or an ion energy source.

10. A cleaning process for a surface of a semiconductor wafer having undesirable materials thereon, comprising the steps of:
- performing a chemical mechanical polish on the surface by applying a liquid thereto, thereby generating a plurality of contaminant particles on the surface;
- removing a majority of the liquid having the plurality of contaminant particles chemisorbed therein so that only a residual layer of the liquid having a thickness of less than 20 angstroms remains on the wafer surface; and
- irradiating the remaining residual layer of liquid with energy to remove the remaining residual layer.

11. The cleaning process for the surface of the semiconductor wafer of claim 10 wherein the step of performing a chemical mechanical polish includes the step of using a liquid that is one of reactive with the surface or reactive with the particles.

12. The cleaning process for the surface of the semiconductor wafer of claim 10 wherein the step of performing a chemical mechanical polish includes the step of using a liquid that is one of non-reactive with the surface or non-reactive with the particles.

13. The cleaning process for the surface of the semiconductor wafer of claim 10 wherein the step of removing a majority of the liquid so that only a residual layer of the liquid remains on the wafer surface comprises the step of spinning.

14. The cleaning process for the surface of the semiconductor wafer of claim 10 wherein the step of removing a majority of the liquid so that only a residual layer of the liquid remains on the wafer surface comprises evaporation.

15. A cleaning process for a surface of a semiconductor wafer of claim 10 wherein the residual layer is less than 10 angstroms thick.

16. A cleaning process for a surface of a semiconductor wafer of claim 15 wherein the residual layer is a monolayer of molecules adsorbed on the surface of the semiconductor wafer, having the contaminant particles chemisorbed therein.

17. A cleaning process for a surface of a semiconductor wafer of claim 15 wherein the residual layer is a monolayer of molecules adsorbed on the surface of the semiconductor wafer, having the contaminant particles adsorbed therein.

18. A cleaning process for a surface of a semiconductor wafer of claim 10 wherein the energy source is one of a photon energy source or an ion energy source.

19. A laser cleaning process for a surface of a semiconductor wafer having undesirable materials thereon, comprising the steps of:
- performing a chemical mechanical polish on the surface of a semiconductor wafer by applying liquid thereto, thereby generating a plurality of contaminant particles chemisorbed within the liquid;
- removing a majority of the liquid by spinning the wafer in the horizontal plane so that only a residual layer of liquid characterized as a monolayer of molecules adsorbed on the surface and having the plurality of contaminant particles chemisorbed therein remains on the entire wafer surface; and
- irradiating the remaining residual layer of liquid with photon energy from the laser to remove the remaining residual layer of liquid and contaminant particles.

20. A laser cleaning process for a surface of a semiconductor wafer having undesirable materials thereon, as claimed in claim 19 further including the step of performing a scrub and removing a majority of the liquid and particles prior to removing a majority of the liquid by spinning.

21. A laser cleaning process for a surface of a substrate having undesirable materials thereon, comprising the steps of:
- performing a chemical mechanical polish on the surface of the substrate, thereby generating a plurality of contaminant particles on the surface of the substrate;
- performing a scrub by applying a liquid to the surface of the substrate suspending therein the plurality of contaminant particles, and removing a majority of the liquid and contaminant particles suspended therein;
- removing a majority of the remaining liquid and contaminant particles suspended therein so that only a residual layer of the liquid having a thickness of less than 10 angstroms and having contaminant particles suspended therein remains on a majority of the wafer surface; and
- irradiating the residual layer of liquid with photon energy from the laser to remove the remaining residual layer.

22. A laser cleaning process for a surface of a semiconductor wafer of claim 21 wherein the substrate is one of a semiconductor wafer, a metal, or a glass.

23. A laser cleaning process for a surface of a semiconductor wafer of claim 21 wherein the residual layer is a monolayer of molecules adsorbed on the surface of the semiconductor wafer, having the contaminant particles chemisorbed therein.

24. A laser cleaning process for a surface of a semiconductor wafer of claim 21 wherein the residual layer is a monolayer of molecules adsorbed on the surface of the semiconductor wafer, having the contaminant particles adsorbed therein.

* * * * *